United States Patent [19]

Erbe

[11] Patent Number: 4,912,769
[45] Date of Patent: Mar. 27, 1990

[54] HEARING AID COMPRISING A PRINTED CIRCUIT BOARD AND HEARING COIL

[75] Inventor: Ehrenfried Erbe, Effeltrich, Fed. Rep. of Germany

[73] Assignee: Siemens Aktiengesellschaft, Berlin and Munich, Fed. Rep. of Germany

[21] Appl. No.: 202,961

[22] Filed: Jun. 6, 1988

[30] Foreign Application Priority Data

Jun. 26, 1987 [DE]   Fed. Rep. of Germany ... 8708892[U]
Jun. 26, 1987 [DE]   Fed. Rep. of Germany ... 8708895[U]

[51] Int. Cl.⁴ .............................................. H04R 25/00
[52] U.S. Cl. ..................................... 381/68.7; 381/68; 381/69
[58] Field of Search ................. 381/68.7, 68, 69, 69.1, 381/69.2; 379/55, 52

[56] References Cited

U.S. PATENT DOCUMENTS

| | | | |
|---|---|---|---|
| 4,245,640 | 1/1981 | Hunt | 128/419 B |
| 4,638,125 | 1/1987 | Buettner | 381/68.4 |
| 4,710,961 | 12/1987 | Büttner | 381/69.2 |

FOREIGN PATENT DOCUMENTS

| | | |
|---|---|---|
| 0140078 | 9/1984 | European Pat. Off. . |
| 8426609.0 | 1/1986 | Fed. Rep. of Germany . |
| 8428488.9 | 3/1986 | Fed. Rep. of Germany . |

*Primary Examiner*—Jin F. Ng
*Assistant Examiner*—Danita R. Byrd
*Attorney, Agent, or Firm*—Hill, Van Santen, Steadman & Simpson

[57] ABSTRACT

The hearing aid has a flexible printed circuit film having a printed circuit wing bent around a rounded portion, and also has a hearing coil. In order to save space, the hearing coil is preferably divided into two smaller, series-connected coil windings. These can be symmetrically arranged in the hearing aid housing. Since the bending coinciding with the rounded portion is not suitable for the contacting of components, the hearing coil is radially arranged thereabove in a protective member. An even more space-saving arrangement of the components in the hearing aid housing thus results.

11 Claims, 1 Drawing Sheet

HEARING AID COMPRISING A PRINTED CIRCUIT BOARD AND HEARING COIL

RELATED APPLICATIONS

The present application is also related to the following applications of the same inventor: "HEARING AID COMPRISING A PRINTED CIRCUIT FILM", U.S. Ser. No. 202,828, filed June 6, 1988; "HEARING AID COMPRISING PRINTED CIRCUIT BOARD", U.S. Ser. No. 202,829, filed June 6, 1988.

BACKGROUND OF THE INVENTION

The present invention is directed to a hearing aid wherein a housing is provided having a printed circuit board therein which has at least one printed circuit wing bent at an angle.

The present invention is also directed to a hearing aid coil of the type employed in a hearing aid for listening.

As a consequence of its relative size, the arrangement of a hearing or listening coil presents special difficulties in the design of hearing aids. Previous solutions have not yet been satisfactory since more space in the inside of the hearing aid is required due to the necessary observation of adequate tolerances between the thick hearing coil and further components. It is disadvantageous to attach the hearing coil to the printed circuit board next to other components since it occupies too much space that could be used for other components. German Utility Model No. 83 27 115 (corresponding to EP No. 0 140 078 and U.S. Pat. No. 4,638,125), incorporated herein, discloses a mounting part that combines the hearing coil and a group of actuators to form a structural unit. The printed circuit board of this device, however, is displaced in the direction toward the housing shell by the mounting part. It can thus no longer be optimally equipped. Given multi-layer amplifier plate arrangements, an entire layer is usually lost because the amplifier arrangement must be integrated asymmetrically relative to the housing shells.

SUMMARY OF THE INVENTION

As object of the present invention is to provide a hearing aid coil arrangement that can be integrated into a hearing aid housing in a more space-saving fashion than previously, and that can nonetheless be integrated therein while observing the required tolerances. It is also an object of the present invention to provide a hearing aid having such a hearing coil arrangement.

According to the invention, a hearing aid coil in a housing a hearing aid is divided into individual series-connected windings. A diameter of the individual windings is less than the prior art single coil windings. Furthermore, the individual coil windings can be spaced from one another and the printed circuit board can be arranged relative to the windings such that the windings are placed opposite at least one bend in the printed circuit board.

By dividing the coil winding into individual windings connected in series, every winding can be designed with a smaller diameter than was previously standard. The narrow windings can have their diameters adapted to the smaller heights of other components used in hearing aids. They can therefore be arranged next to such components without an empty space arising thereabove.

Given the advantageous design disclosed herein, the hearing aid coil is divided into two windings and is arranged on a printed circuit board such that the printed circuit board can be integrated in the housing symmetrically relative to the housing shells. The symmetrical arrangement of the printed circuit board has a space-saving influence since printed circuit board surfaces lying opposite one another can be equipped with components.

In order to be able to adapt to printed circuit boards, particularly printed circuit films, as exactly as possible to the shape of the hearing aid housing, it has proven advantageous to provide these boards with bending zones. Since the bending zones must be flexible, this region of the printed circuit film previously remained free of components (see, for example, German Utility Model No. 84 28 488 corresponding to U.S. Pat. No. 4,710,961, incorporated herein). This is in turn an unnecessary waste of the limited interior space of the hearing aid.

As a result of the advantageous positioning of the hearing coil above and having its longitudinal axis roughly along the bending zone of the printed circuit board, a mounting region that remained unutilized earlier is now used in the hearing aid housing. This leads to an additional space-saving in the hearing aid housing.

The hearing coil can be divided into two windings and the printed circuit board can be bent in two different zones, whereby a symmetrical arrangement of the printed circuit board and of the hearing coil relative to the housing shell results. Such a symmetrical arrangement guarantees an optimum equipping of the printed circuit board given a simultaneously optimum arrangement of the hearing coil.

DESCRIPTION OF THE PREFERRED EMBODIMENTS

Figure 1:
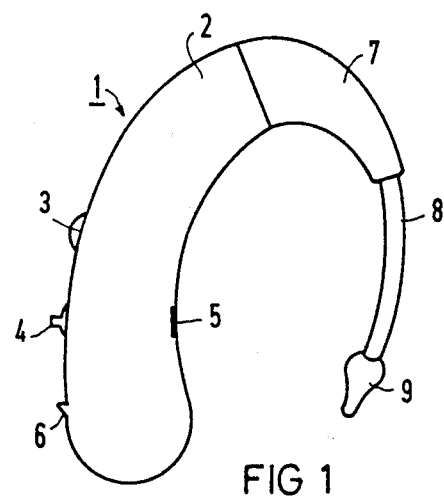
FIG. 1 is an outside view of a hearing aid according to the invention to be worn behind the ear.

FIG. 1 shows a hearing aid 1 to be worn behind the ear, the housing 2 of which contains electrical as well as electro-mechanical elements for processing acoustic signals. This processing can be influenced by a number of externally accessible operating elements, for example volume control 3, on-off switch 4, and actuator arrangement 5 (not visible). The hearing aid 1 also has a battery compartment 6 and a carrying hook 7 at the opposite end. The processed acoustic signals are supplied to the ear via a hose 8 secured to a carrying hook 7 and via an ear adapter member 9 adapted to the auditory canal of the hearing-impaired person.

Figure 2:
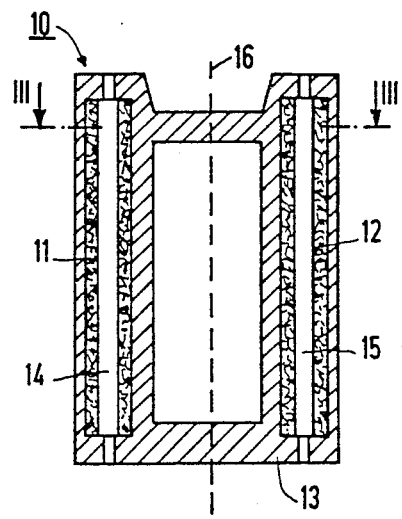
FIG. 2 is a crosssectional view through a protective member that is employed according to the invention.

FIG. 2 shows the hearing coil arrangement 10 of the hearing aid 1. It has two coil windings 11, 12 connected in series and a protective member 13 that holds the coils 11, 12 wound onto different bodies 14, 15. The protective member 13 is an approximately frame-shaped molded part that is cast around the coils 11, 12. The hearing coils 11 and 12 are arranged on opposite sides of the protective member 13 equidistant from the central line 16 proceeding longitudinally through the member 13. The hearing coils 11, 12 thus lie symmetrically relative to the central line 16 and parallel to one another in the protective member.

Figure 3:
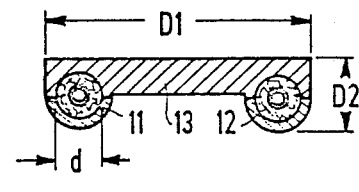
FIG. 3 is the protective member illustrated in FIG. 2 shown in cross-sectional view along line III—III indicated in FIG. 2.

The width of the protective member 13 corresponds to about that of the interior of the housing 2. This width, referenced D1 in FIG. 3, is 6 mm. The height D2 of the protective member 13 is less than 2 mm. The hearing coil windings 11, 12 contained therein each have a diameter d of about 1.3 mm and are thus about half as broad in diameter as traditional coil windings of identical length.

Figure 4:
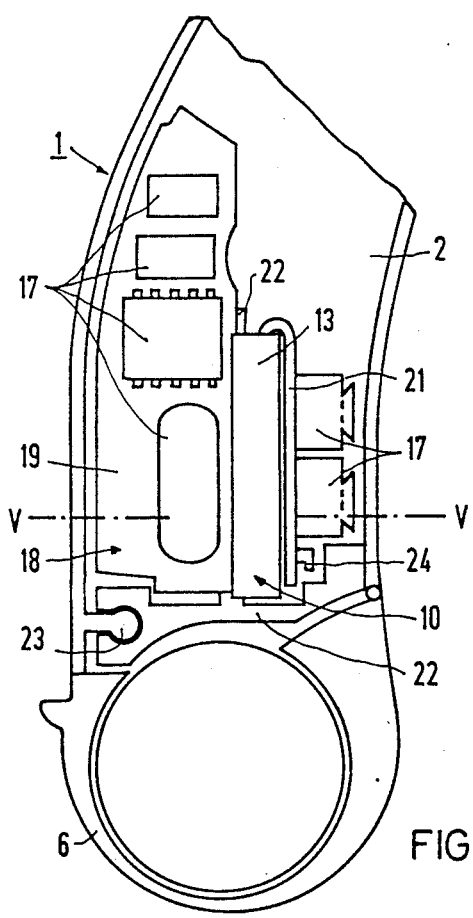
FIG. 4 is a side view of an equipped printed circuit board inserted into the hearing aid housing that holds the hearing coil arrangement of FIG. 2.

FIG. 4 shows the protective member 13 together with hearing coils 11, 12 in their integrated condition in the housing 2 of the hearing aid 1. The hearing coils 11, 12 as well as further components 17 are held by a flexible printed circuit film 18 in which the electrical connecting lines for the components 17 are situated. The printed circuit film 18 comprises two printed circuit wings 19, 20 and an extension arm 21. The printed circuit wings 19, 20 are folded around a carrier 22. The carrier 22 is secured to the housing 2 with a snap-in connection. A small cross-rod 23 projecting into the interior from the housing 2 serves for fastening the carrier 22 to the housing by the aforementioned snap-in connection.

The hearing coil arrangement 10 is secured to the printed circuit film 18 by the extension arm 21 that is folded over the hearing coil arrangement 10 and is hooked to a hook 24 connected to the carrier 22.

Figure 5:
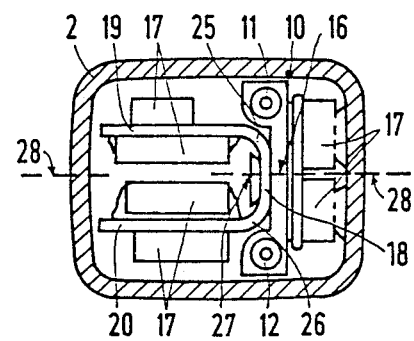
FIG. 5 is the printed circuit board arrangement shown in a crossectional view taken along the line V—V in FIG. 4.

As may be seen from FIG. 5, the two hearing coils 11, 12 lie directly above the bending zones 25, 26 of the folded printed circuit film 18. Since no components can be directly contacted on the bending zones 25, 26 because of mechanical stressing, it is especially advantageous to arrange the hearing coils 11, 12 radially above and along the rounded positions of these bending zones 25, 26, and to thus utilize the space present there.

The symmetrical positioning of the hearing coil arrangement 10 with respect to the center line 27 of the printed circuit film 18 and with respect to the symmetry axis 28 of the housing 2 also advantageous in view of a rational exploitation of the small mounting space. As clearly proceeds from FIG. 5, all four mounting sides of the printed circuit wings 19 and 20 can be used for further components 17.

Although various minor changes and modifications might be proposed by those skilled in the art, it will be understood that I wish to include within the claims of the patent warranted hereon all such changes and modifications as reasonably come within my contribution to the art.

I claim as my invention:

1. A hearing aid, comprising:
a housing having a printed circuit board therein having at least two printed circuit wings bent at respective rounded portions;
a hearing coil in a protective member adjacent and attached to the printed circuit board at a surface of the printed circuit board between the rounded portions; and
the hearing coil being divided into individual series connected windings which are separated and spaced apart from one another by said protective member such that they are respectively arranged at spaced locations adjacent said rounded portions.

2. A hearing aid according to claim 1 wherein the individual windings are arranged parallel to one another.

3. A hearing aid according to claim 2 wherein said protective member is frame-shaped and retains the individual windings and wherein the individual windings are positioned symmetrical with respect to a center line of the protective member.

4. A hearing aid according to claim 3 wherein said center line of the protective member also lies in a plane passing through a center line perpendicular to the printed circuit board, and wherein said protective member is connected to said printed circuit board.

5. A hearing aid according to claim 4 wherein the center line of the protective member lies in a plane running through a symmetry axis of the housing, said plane being perpendicular to the circuit board where the protective member connects.

6. A hearing aid according to claim 1 wherein the printed circuit board first and second wings are bent at 90° to a central portion of the circuit board, said individual windings being provided in said protective member connected at the central portion of the circuit board, and wherein each of the individual windings runs parallel and adjacent to an outer surface of said respective rounded portions where each of the circuit wings joins to the central portion of the circuit board.

7. A hearing aid according to claim 6 wherein the protective member comprising a housing having a flat central portion connecting to the central portion of the circuit board and each of the individual windings lies at outer ends of the central portion and are retained about the central portion adjacent the rounded portions of the circuit board.

8. A hearing aid according to claim 7 wherein each of the coils is positioned between a side of the housing and the respective rounded portion.

9. A hearing aid, comprising:
a housing having a printed circuit board therein having at least one printed circuit wing bent at at least one rounded portion;
a hearing coil adjacent the printed circuit board;
the hearing coil being divided into individual series connected windings;
a protective member holding the individual windings such that they are arranged at different locations; and
the individual windings being integrated in the protective member.

10. A hearing aid according to claim 9 wherein the individual windings are cast in the protective member.

11. A hearing aid, comprising:
a housing having a printed circuit board therein having two printed circuit wings bent at respective rounded portions where they connect to a central portion of the board;
a hearing coil arrangement adjacent the central portion of the printed circuit board;
the hearing coil arrangement being divided into individual first and second windings, one of the windings being positioned at each respective rounded portion;
the hearing coil windings being located adjacent to and exteriorly of the bends; and
the hearing coil windings being contained in a common protective encasement.

* * * * *